United States Patent
Chini et al.

(10) Patent No.: US 10,644,906 B2
(45) Date of Patent: May 5, 2020

(54) EMISSION CONTROL FOR RECEIVER OPERATING OVER UTP CABLES IN AUTOMOTIVE ENVIRONMENT

(71) Applicant: Avago Technologies General IP (Singapore) Pte. Ltd., Singapore (SG)

(72) Inventors: Ahmad Chini, Mission Viejo, CA (US); Peiqing Wang, Laguna Beach, CA (US); Mehmet Vakif Tazebay, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 1 day.

(21) Appl. No.: 16/054,973

(22) Filed: Aug. 3, 2018

(65) Prior Publication Data

US 2020/0044896 A1 Feb. 6, 2020

(51) Int. Cl.
| | | |
|---|---|---|
| H04L 25/03 | (2006.01) | |
| H01B 11/08 | (2006.01) | |
| H03G 3/00 | (2006.01) | |
| H03M 1/06 | (2006.01) | |
| H04B 1/62 | (2006.01) | |

(52) U.S. Cl.
CPC ........ *H04L 25/03057* (2013.01); *H01B 11/08* (2013.01); *H03G 3/001* (2013.01); *H03M 1/0626* (2013.01); *H04B 1/62* (2013.01); *H04L 2025/0349* (2013.01)

(58) Field of Classification Search
CPC .............................. B21F 27/124; E04C 5/0618
See application file for complete search history.

(56) References Cited

U.S. PATENT DOCUMENTS

| | | | |
|---|---|---|---|
| 2004/0105503 A1* | 6/2004 | Mohamadzade | ... H04L 25/0274 375/257 |
| 2007/0014331 A1* | 1/2007 | Eldon | .................... H04N 19/63 375/130 |
| 2007/0237270 A1* | 10/2007 | Mezer | ...................... H04B 3/23 375/346 |
| 2008/0137499 A1* | 6/2008 | Suzuki | ................ G11B 7/08511 369/53.15 |

(Continued)

*Primary Examiner* — Shuwang Liu
*Assistant Examiner* — Gina M Mckie
(74) *Attorney, Agent, or Firm* — Morgan, Lewis & Bockius LLP

(57) ABSTRACT

A transceiver system includes a transmitter circuit having a line driver with a programmable signal level to generate a transmit signal for transmission in an automotive environment over an unshielded-twisted pair (UTP) cable. The transceiver system further includes a physical layer (PHY) receiver. The PHY receiver includes a high-pass filter (HPF), an adaptive feed-forward equalizer (FFE) block and a noise aware adaptation block. The HPF rejects transient noise of a received signal, and the FFE block receives a digital signal and adaptively filters out narrowband continuous wave (CW) noise using an adaptation signal. The digital signal is based on the received signal, and the noise aware adaptation block receives an error signal and generates the adaptation signal. The error signal is generated based on an equalized signal of the FFE block and an estimated signal. The combined transmit and receive circuitry allow lowering emission while rejecting strong receiver automotive noises.

20 Claims, 4 Drawing Sheets

(56) References Cited

U.S. PATENT DOCUMENTS

| | | | |
|---|---|---|---|
| 2008/0159414 A1* | 7/2008 | Brecher | H04L 25/0266 375/258 |
| 2012/0106678 A1* | 5/2012 | Currivan | H04L 27/0014 375/320 |
| 2019/0154439 A1* | 5/2019 | Binder | G01B 11/26 |

* cited by examiner

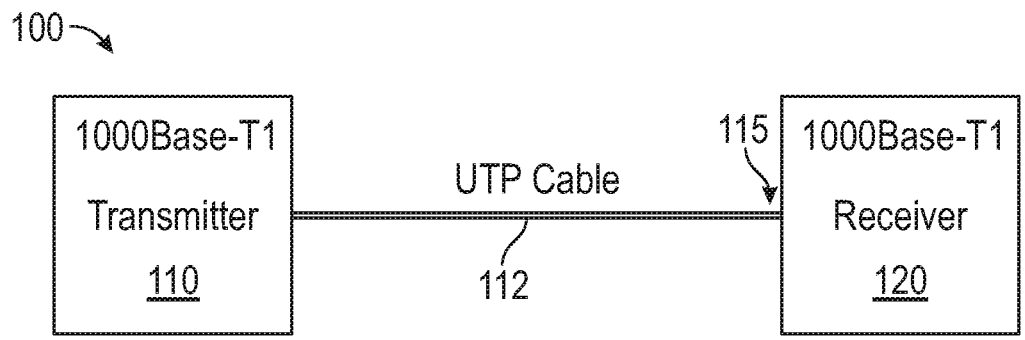
FIG. 1
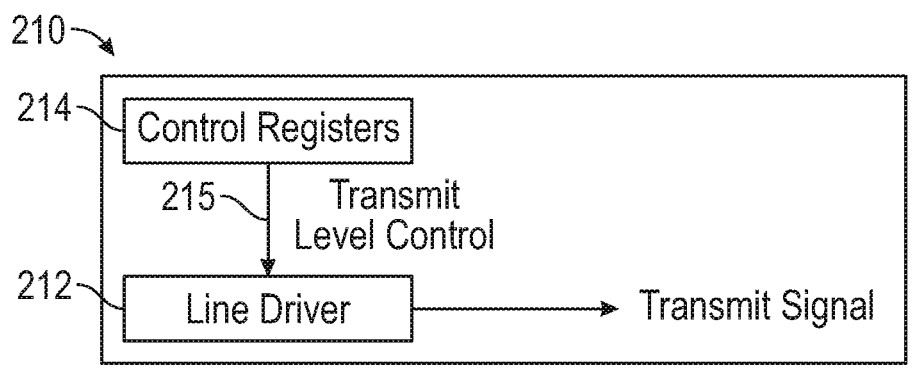
FIG. 2A
| Register Value | Transmit Level |
|---|---|
| 000 | 1000mVpp |
| 001 | 900mVpp |
| 010 | 800mVpp |
| 011 | 700mVpp |
| 100 | 600mVpp |
| 101 | 500mVpp |
| 110 | 400mVpp |
| 111 | 300mVpp |
FIG. 2B

EMISSION CONTROL FOR RECEIVER OPERATING OVER UTP CABLES IN AUTOMOTIVE ENVIRONMENT

TECHNICAL FIELD

The present description relates generally to communications, and more particularly, to emission control for a receiver operating over unshielded twisted pair (UTP) cables in automotive environment.

BACKGROUND

The IEEE P802.3 bp standard defines the 1000BASE-T1 physical layer (PHY) specifications and management parameters for point-to-point full duplex 1 Gb/s Ethernet operation over single balanced twisted-pair cabling. The defined PHY can support automotive, industrial controls and automation, transportation (e.g., aircraft, railway and heavy trucks) and other applications such as carbon footprint sensitive applications that benefit by a reduction in the number of wire pairs and magnetics. In some applications, such as automotive applications, the unshielded twisted pair (UTP) cables can be of special interest due to low cost and longevity of these cables.

However, operation at Gigabit speed over UTP cables can be challenging because of electromagnetic compatibility (EMC) issues for low emission and high immunity to radio interferences. In-car testing of 1000BASE-T1 PHY over UTP cables suggests emission requirements that exceeds the international special committee on radio interference (CISPR) 25 Class 5 standard and the tightest strip-line limits. A solution for emission improvement with a PHY receiver that can withstand large interference is desired.

BRIEF DESCRIPTION OF THE DRAWINGS

Certain features of the subject technology are set forth in the appended claims. However, for purposes of explanation, several embodiments of the subject technology are set forth in the following figures.

FIG. 1 is a high-level block diagram illustrating an example of a transceiver for communication in an automotive environment over an unshielded-twisted pair (UTP) cable, according to aspects of the subject technology.

FIGS. 2A-2B are a high-level block diagram illustrating an example of a transmitter for transmission in an automotive environment over a UTP cable and a corresponding table, according to aspects of the subject technology.

DETAILED DESCRIPTION

Figure 3A:
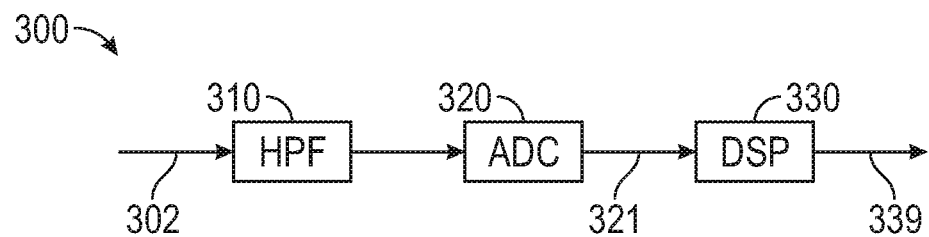
FIGS. 3A-3B are a high-level block diagram illustrating an example of a physical layer (PHY) receiver for receiving signals in an automotive environment over a UTP cable and a corresponding digital signal processing (DSP) block, according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, systems and configurations are described for improving emission performance and providing a physical layer (PHY) receiver with improved noise immunity at reduced signal level. For example, a programmable transmit power back off is provided in the PHY transmitter to satisfy emission requirements over unshielded twisted pair (UTP) cables. The subject technology can reduce transmit signal level to improve emission performance without severely affecting PHY noise immunity. The disclosed solution includes adapting and rejecting narrowband continuous wave (CW) noises, rejecting low-frequency transient noises using high-pass filter in the receiver, performing error shaping to reduce error propagation due to transient noises and using noise-aware digital signal processing (DSP) adaptation.

FIG. 1 is a high-level block diagram illustrating an example of a transceiver 100 for communication in an automotive environment over an unshielded-twisted pair (UTP) cable, according to aspects of the subject technology. The transceiver 100 includes a transmitter 110 for transmitting in an automotive environment over a UTP cable 112 and a receiver 120 for receiving the transmitted signal over the UTP cable 112. The transmitter 110 can transmit signals at an adjustable level, which can be controlled by a number of registers or via a transmit-level control signal receivable from the receiver 120, as discussed in more detail herein.

The receiver 120 can be a physical layer (PHY) receiver, for example, a 1000BASE-T1 PHY receiver. In-car testing of the 1000BASE-T1 PHY of IEEE P802.3 bp standard (i.e., clause 97) over type A UTP cables suggests emission requirements exceeding international special committee on radio interference (CISPR) 25 Class 5 and the tightest stripline limits. The solution of the subject technology provides emission improvements such that the PHY receiver 120 can withstand large automotive noises. The transmit signal level of the transmitter 110 can be adjusted to improve emission performance without severely affecting PHY noise immunity of the PHY receiver 120.

To improve noise immunity at reduced signal level, the PHY receiver 120 can be designed to adaptively filter out narrowband CW noises, reject low-frequency transient noises using high-pass filter in the receiver, perform error shaping to reduce error propagation due to transient noises and include noise aware digital signal processing (DSP) adaptation. A programmable transmit power back-off can be provided by the PHY to satisfy emission requirements of the transmitter 110 over UTP cable 112, as discussed herein.

FIGS. 2A-2B are a high-level block diagram illustrating an example of a transmitter 210 for transmission in an automotive environment over a UTP cable and a corresponding table 220, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The transmitter 210 includes, but is not limited to, a line driver 212 and a control circuit 214. The line driver 212 can drive a UTP cable at an adjustable transmit level controllable by a transmit-level control signal 215 from the control circuit 214. The control circuit 214 can include a number of control registers. The values of the registers, as shown in the table 220, represent various transmit signal levels. A number of transmit levels from 1000 mVpp to 300 mVpp are represented by register values between 000 and 111. The transmit level of 1000 mVpp can be a default transmit level of a PHY transmitter such as the transmitter 210.

For example, a transmit level of 300 mVpp can provide a 10 dB emission improvement over a 1 Vpp signal. Decision for optimum transmit signal level may be made based on prior emission and immunity (EMC) tests and may be adjusted at any time depending on particular installation and EMC requirements. The transmit-level control signal 215 from the control circuit 214 can reduce the transmit level of the line driver 212 to help with the emission. It is to be noted that the emission control can affect noise immunity in an automotive environment if proper measures are not taken in the receiver design. The subject technology provides a receiver design that can include measures to reject the narrowband CW noises and low-frequency transient noises, perform error shaping to reduce error propagation due to transient noises and to uses noise-aware DSP adaptation, as discussed herein.

Figure 3B:
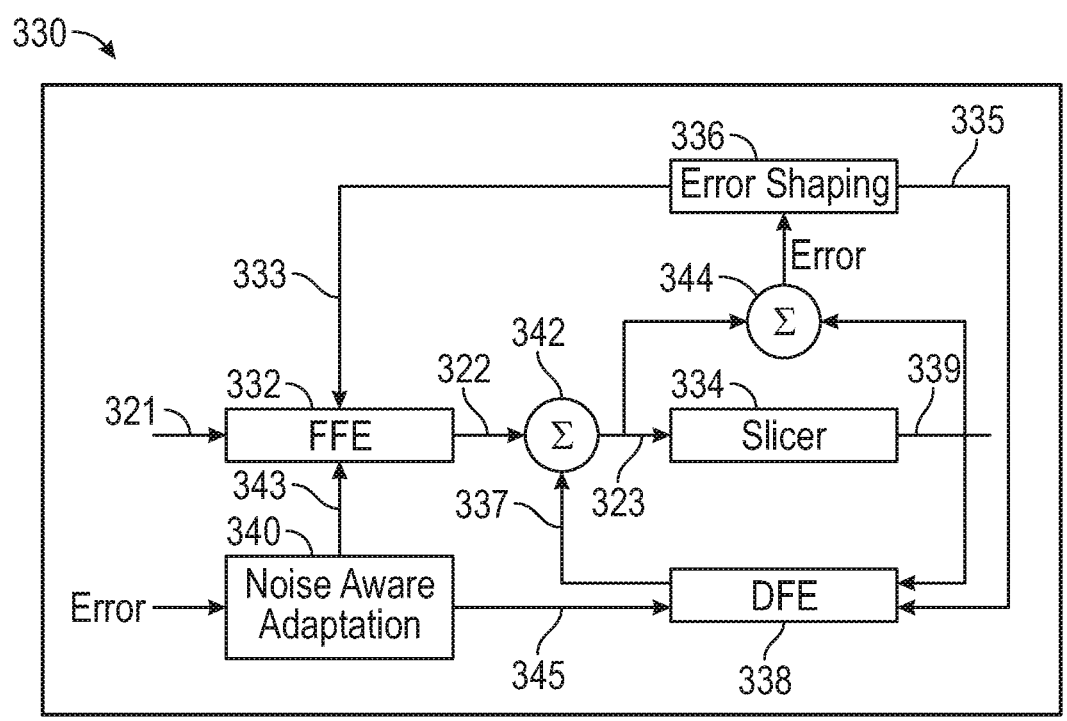

FIGS. 3A-3B are a high-level block diagram illustrating an example of a PHY receiver 300 for receiving signals in an automotive environment over a UTP cable and a corresponding DSP block 330, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The PHY receiver 300 includes, but is not limited to, a high-pass filter (HPF) circuit 310, an analog-to-digital converter (ADC) circuit 320, and a DSP block 330. The HPF 310 can reject transient noise of a signal 302 received over a UTP cable. In some implementations, the HPF 310 has a bandwidth of about 40 MHz or more and can be used to attenuate most of the automotive transient noises of the received signal 302. The ADC 320 is a high-resolution ADC with an effective number of bits (ENOB) of about 8 bits or more. The ADC 320 can provide a digital signal 321 with a high dynamic range, allowing rejection of noise by subsequent signal processing blocks. The DSP block 330 can adaptively filter out narrowband CW noise using error shaping and noise-aware DSP adaptation, as discussed herein, to generate an estimated signal 339.

The block diagram 330 shown in FIG. 3B shows various components and functionality of the DSP block 330. The DSP block 330 includes, but is not limited to, a feed-forward equalization (FFE) block 332, a slicer block 334, an error shaping block 336, a decision feedback equalizer (DFE) block 338, a noise-aware adaptation block 340, a first subtractor 342 and a second subtractor 344. The FFE block 332 is a multi-tap adaptive FFE block and receives the digital signal 321 and adaptively filters out narrowband CW noise of the received digital signal 321 using an adaptation signal 343 provided by the noise-aware adaptation block 340 and a shaped error signal 333 from the error shaping block 336. The equalized signal 322 generated by the FFE block 332 is received by the first subtractor 342.

The first subtractor 342 receives a feedback signal 337 from the DFE block, subtracts the feedback signal 337 from the equalized signal 322 and generates a first signal 323 that is used by the slicer block 334. The slicer block 334 generates an estimated signal 339 using the first signal 323 by predicting a most likely value of a signal (e.g. between −1, 0, and 1 values of a tri-level signal). For example, if a value of the first signal 323 is 1.1, the slicer may predict a value of 1 for the estimated signal 339. The second subtractor 344 subtracts the estimated signal 339 from the first signal 323 and generates an error signal. The error signal is suitable shaped by the error shaping block 336 to generate the shaped-error signals 333 and 335.

The shaped error signal 333 is used by the FFE block 332 to adjust equalization parameters of the FFE block 332. The shaped error signal 339 is passed to the DFE block 338. The DFE block 338 further receives the estimated signal 339 from the slicer 334 and an adaptation signal 345 from the noise-aware adaptation block 340. The DFE block 338 uses the estimated signal 339, the shaped error signal 335 and the adaptation signal 345 to generate the feedback signal 337. The noise-aware adaptation block 340 employs the error signal from the second subtractor 344 to generate the adaptation signals 343 and 345 used for adapting parameters of the FFE block 332 and the DFE block 338, respectively. In summary, the DSP block 330 adaptively filters out narrowband CW noise using error shaping and noise-aware DSP adaptation.

Figure 4:
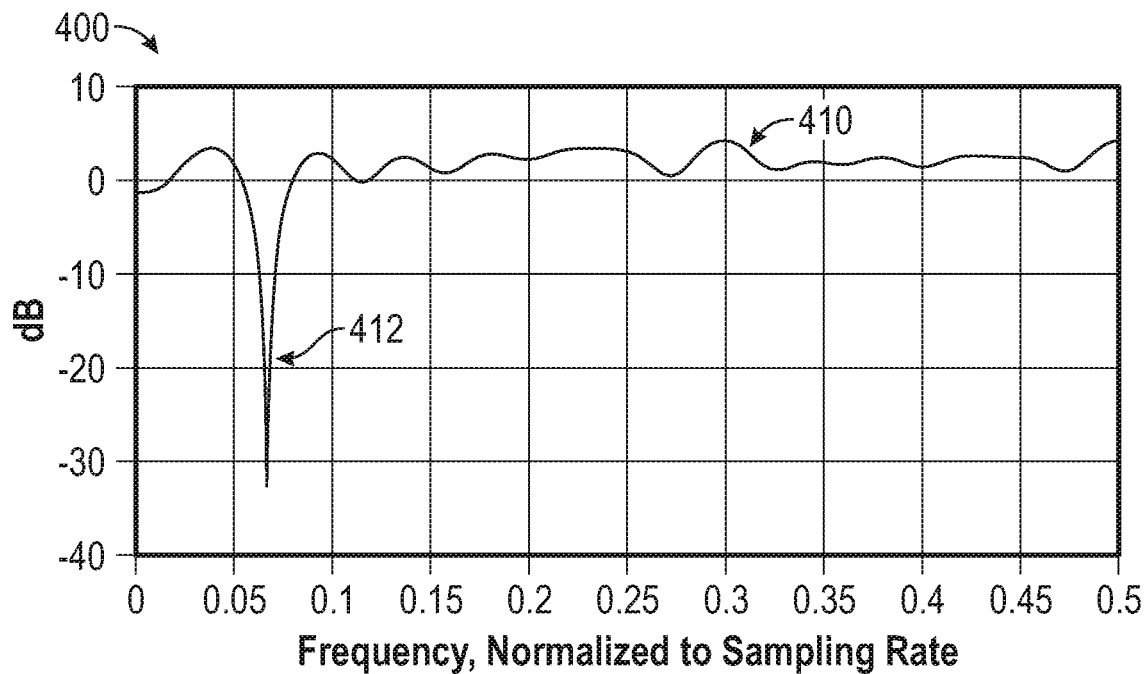
FIG. 4 is a chart illustrating an example of a feed-forward equalization (FFE) notch, according to aspects of the subject technology.

FIG. 4 is a chart 400 illustrating an example of a FFE notch 412, according to aspects of the subject technology. The chart 400 shown in FIG. 4 depicts a plot 410 of a frequency response of the FFE block 332 of FIG. 3B. The plot 410 includes a notch 412 (FFE notch) at a suitable frequency (e.g., about 50 MHz for a sampling clock of 750 MHz) to reject a narrowband CW noise that is a characteristic of an automotive environment. The horizontal axis of the chart 400 is a normalized frequency that is normalized to the sampling frequency (e.g., 750 MHz). The example notch 412 has an attenuation of more than 30 dB.

Figure 5:
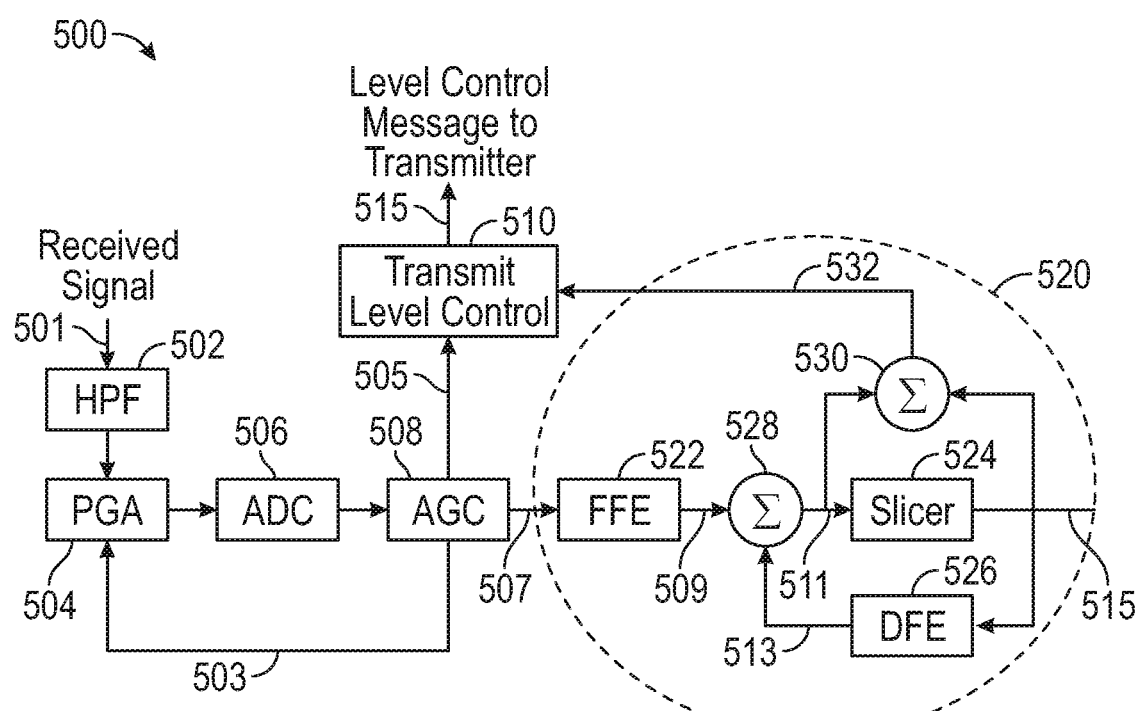
FIG. 5 is a block diagram illustrating an example of a PHY receiver including a transmit-level control block, according to aspects of the subject technology.

FIG. 5 is a block diagram illustrating an example of a PHY receiver 500 including a transmit-level control block 510, according to aspects of the subject technology. While the level of the transmit signal of the line driver 212 of FIG. 2A may be set fixed at a reduced level to help emission, as discussed above, it is possible to adjust the transmit level based on channel attenuation, channel length or signal-to-noise ratio (SNR). This adaptive power back off would further improve emission and immunity in automotive environments over UTP cables.

The PHY receiver 500 includes a HPF 502, a programmable gain amplifier (PGA) 504, an ADC 506, an automatic gain control (AGC) 508, a transmit-level control block 510 and a DSP 520. The HPF revives an input signal 501 (e.g., a radio-frequency (RF) signal) and rejects the low frequency (e.g., below about 40 MHz) transient noise. The filtered signal is amplified by the PGA 504, the gain of which is controlled by a feedback 503 from the AGC 508. The ADC 506 is a high-resolution ADC, for example, with an ENOB of more than 8 bits. The digital signal generated by the ADC 506 is received by the AGC 508. The information collected in AGC 508 can show channel information including channel attenuation. The channel attenuation 505 can be used by the transmit-level control block 510 along with an error signal 532 received from the DSP block 520 to decide whether the transmit level needs to be altered (e.g., reduced or increased). The transmit-level control block 510 generates a transmit-level control signal 515, which can be used to adapt the transmit level of the line driver (e.g., 212 of FIG. 2A) to reduce emission.

The DSP block 520 includes an FFE 522, a first subtractor 528, second subtractor 530, a slicer 524 and a DFE 526. The FFE 522 receives the digital signal 507 from the AGC 508 and generates an equalized signal 509. The first subtractor 528 subtracts a feedback signal 513 received from the DFE 526 from the equalized signal 509 of the FFE 522 and generates a first signal 511. The slicer 524 provides an estimated signal 515 based on the first signal 511, as discussed above. The estimated signal 515 is used by the DFE 526 to generate the feedback signal 513. The second subtractor 530 can subtract the estimated signal 515 from the first signal 511 to generate the error signal 532, which is used by the transmit-level control block 510 to generate the transmit-level control signal 515, which is used to dynamically adapt the transmit level of the line driver.

Figure 6:
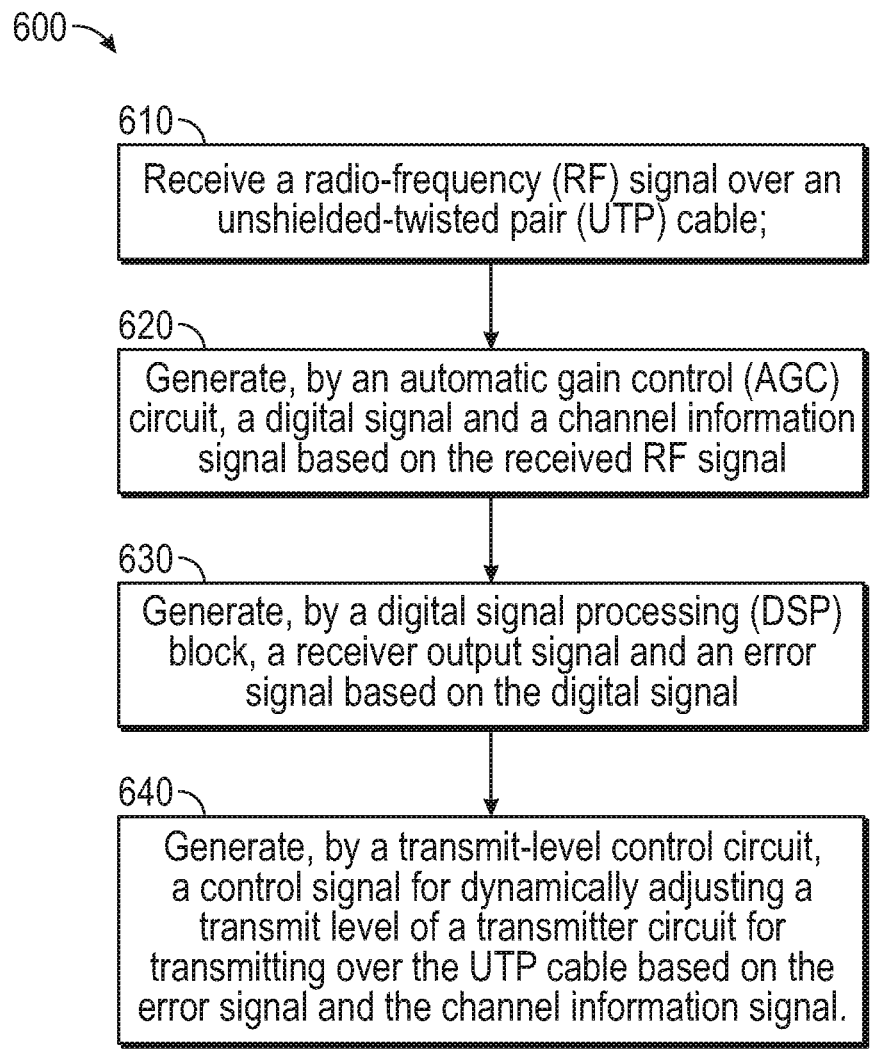
FIG. 6 is a flow diagram illustrating an example method of receiving in an automotive environment over a UTP cable and generating a transmit-level control signal, according to aspects of the subject technology.

FIG. 6 is a flow diagram illustrating an example method 600 of receiving in an automotive environment over a UTP cable and generating a transmit-level control signal, according to aspects of the subject technology. The method 600 includes receiving a signal (e.g., 115 of FIG. 1 or 501 of FIG. 5) over an unshielded-twisted pair (UTP) cable (e.g., 112 of FIG. 1) (610). The method 600 further includes generating, by an automatic gain control (AGC) circuit (e.g., 508 of FIG. 5), a digital signal (e.g., 503 of FIG. 5) and a channel information signal (e.g., 505 of FIG. 5) based on the received signal (620). A digital-signal processing (DSP) block (e.g., 330 of FIG. 3B or 520 of FIG. 5) can generate a estimated signal (e.g., 525 of FIG. 5) and an error signal (e.g., 532 of FIG. 5) based on the digital signal (630). A transmit-level control circuit (e.g., 510 of FIG. 5) can generate a control signal (e.g., 515 of FIG. 5) for dynamically adjusting a transmit level of a transmitter circuit (e.g., 210 of FIG. 2A) for transmitting over the UTP cable based on the error signal and the channel information signal (640).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A transceiver system comprising:
   a transmitter circuit including a line driver configurable to generate a transmit signal for transmission in an automotive environment over an unshielded-twisted pair (UTP) cable; and
   a physical layer (PHY) receiver, wherein the PHY receiver comprises:
      a high-pass filter (HPF) configured to reject transient noise of a received signal;
      a noise aware adaptation block configured to receive an error signal and to generate an adaptation signal;
      an error shaping block configured to shape the error signal to generate a shaped error signal; and
      an adaptive feed-forward equalizer (FFE) block configured to receive a digital signal and to adaptively filter out narrowband continuous wave (CW) noise using the adaptation signal, the digital signal being based on the received signal,
      wherein the error signal is generated based on an equalized signal of the FFE block and an estimated signal.

2. The transceiver system of claim 1, wherein the PHY receiver further comprises a decision feedback equalizer (DFE) block configured to receive the shaped error signal, the estimated signal and the adaptation signal and to generate a feedback signal.

3. The transceiver system of claim 2, wherein the PHY receiver further comprises a slicer block configured to provide the estimated signal based a first signal resulting from subtraction of the feedback signal from the equalized signal.

4. The transceiver system of claim 2, wherein the PHY receiver further comprises a first subtraction block configured to generate a first signal based on subtraction of the feedback signal from the equalized signal.

5. The transceiver system of claim 4, wherein the PHY receiver further comprises a second subtraction block configured to generate the error signal by subtracting the estimated signal from the first signal.

6. The transceiver system of claim 5, wherein the PHY receiver further comprises a high-resolution analog-to-digital converter (ADC) configured to convert the received signal to the digital signal, and wherein the high-resolution ADC comprises an ADC with an effective number of bits (ENOB) of more than 8 bits.

7. The transceiver system of claim 6, wherein the FFE block comprises a multi-tab FFE configured to receive the digital signal, the shaped error signal, and the feedback signal and to generate the equalized signal based on the digital signal, the shaped error signal, and the feedback signal.

8. The transceiver system of claim 1, wherein the transmitter circuit further comprises a transmit-level control circuit configured to generate a control signal to adjust a transmit level of the line driver.

9. The transceiver system of claim 8, wherein the transmit-level control circuit comprises a plurality of control register, and wherein the control signal is generated based on content of the plurality of control registers including a number of transmit-level choices lower than a default transmit level of the line driver.

10. A receiver circuit comprising:
an automatic gain control (AGC) circuit configured to generate a digital signal and a channel information signal based on a received signal over an unshielded-twisted pair (UTP) cable;
a digital-signal processing (DSP) block configured to generate an estimated signal and an error signal based on the digital signal; and
a transmit-level control circuit configured to generate a control signal for dynamically adjusting a transmit level of a transmitter circuit for transmitting over the UTP cable,
wherein the transmit-level control circuit is configured to generate the control signal based on the error signal and the channel information signal.

11. The receiver circuit of claim 10, wherein receiver comprises a 1000BASE-T1 physical layer (PHY) receiver, and wherein the transmit-level control circuit is configured to generate the control signal to adapt for dynamically adjusting the transmit level of the transmitter circuit to be compatible with the 1000BASE-T1 PHY receiver.

12. The receiver circuit of claim 11, further comprising a high-pass filter (HPF), a programmable gain amplifier (PGA) circuit and a high-resolution analog-to-digital converter (ADC), wherein the high-resolution ADC comprises an ADC with an effective number of bits (ENOB) of more than 8 bits.

13. The receiver circuit of claim 12, wherein the HPF is configured to filter out a transient noise of a received signal, and the PGA is configured to amplify a filtered signal output of the HPF by a gain controlled by an AGC feedback signal.

14. The receiver circuit of claim 10, wherein the DSP block comprises a feed-forward equalizer (FFE), a slicer, a decision feedback equalizer (DFE), a first subtractor and a second subtractor.

15. The receiver circuit of claim 14, wherein the FFE is configured to receive an output signal of the AGC circuit and to generate an equalized signal, and wherein the slicer is coupled to the first subtractor that is configured to subtract a feedback signal from the equalized signal and to generate a first signal.

16. The receiver circuit of claim 15, wherein the slicer is configured to generate the estimated signal based on the first signal, wherein the second subtractor is configured to subtract the estimated signal from the first signal and to generate the error signal.

17. The receiver circuit of claim 15, wherein the DFE is configured to receive the estimated signal and to generate the feedback signal.

18. A method comprising:
receiving a signal over an unshielded-twisted pair (UTP) cable;
generating, by an automatic gain control (AGC) circuit, a digital signal and a channel information signal based on the received signal;
generating, by a digital signal processing (DSP) block, an estimated signal and an error signal based on the digital signal; and
generating, by a transmit-level control circuit, a control signal for dynamically adjusting a transmit level of a transmitter circuit for transmitting over the UTP cable based on the error signal and the channel information signal.

19. The method of claim 18, wherein the DSP block comprises a feed-forward equalizer (FFE), a slicer, a decision feedback equalizer (DFE), a first subtractor and a second subtractor, and wherein the FFE is configured to receive an output signal of the AGC circuit and to generate an equalized signal.

20. The method of claim 18, wherein the slicer is coupled to the first subtractor that is configured to subtract a feedback signal from the equalized signal and to generate a first signal.

* * * * *